US011901925B2

(12) United States Patent
Nguyen et al.

(10) Patent No.: US 11,901,925 B2
(45) Date of Patent: Feb. 13, 2024

(54) METHOD AND APPARATUS FOR CANCELLING FRONT-END DISTORTION

(71) Applicant: Marvell Asia Pte Ltd, Singapore (SG)

(72) Inventors: Ray Luan Nguyen, Fountain Valley, CA (US); Benjamin Tomas Reyes, Cordoba (AR); Geoffrey Hatcher, Lake Forest, CA (US); Stephen Jantzi, Laguna Beach, CA (US)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 17/813,753

(22) Filed: Jul. 20, 2022

(65) Prior Publication Data
US 2023/0036435 A1 Feb. 2, 2023

Related U.S. Application Data

(60) Provisional application No. 63/224,276, filed on Jul. 21, 2021.

(51) Int. Cl.
*H04B 1/12* (2006.01)
*H04B 1/40* (2015.01)

(52) U.S. Cl.
CPC ............... *H04B 1/12* (2013.01); *H04B 1/40* (2013.01)

(58) Field of Classification Search
CPC .... H04B 1/12; H04B 1/40; H04B 2001/0425; H04B 1/0475; H04B 1/123; H04B 1/525; H04B 1/38; H03M 1/12; H03M 1/66; H03M 1/1042; H03F 1/3258
See application file for complete search history.

(56) References Cited

U.S. PATENT DOCUMENTS

| 10,305,541 B2 | 5/2019 | Avitan |
| 2013/0044791 A1 | 2/2013 | Rimini et al. |
| 2016/0119024 A1 | 4/2016 | Muljono et al. |
| 2016/0156375 A1* | 6/2016 | Yang ..................... H03F 1/3241 375/297 |

(Continued)

OTHER PUBLICATIONS

Ma, Y. et al., "Fast Baseband Polynomial Inverse Algorithm for Nonlinear System Compensation," *IEEE 75th Vehicular Technology Conference (VTC Spring 2012)*, pp. 1-5 (2012).

*Primary Examiner* — Dac V Ha

(57) ABSTRACT

Transceiver circuitry in an integrated circuit device includes a receive path including an analog front end for receiving analog signals from an analog transmission path and conditioning the analog signals, and an analog-to-digital converter configured to convert the conditioned analog signals into received digital signals for delivery to functional circuitry, and a transmit path including a digital front end configured to accept digital signals from the functional circuitry and to condition the accepted digital signals, and a digital-to-analog converter configured to convert the conditioned digital signals into analog signals for transmission onto the analog transmission path. At least one of the analog front end and the digital front end introduces distortion and outputs a distorted conditioned signal. The transceiver circuitry further includes distortion correction circuitry at the one of the analog front end and the digital front end, to determine and apply a distortion cancellation function to the distorted signal.

19 Claims, 15 Drawing Sheets

(56) References Cited

U.S. PATENT DOCUMENTS

| | | | |
|---|---|---|---|
| 2016/0173165 A1* | 6/2016 | Choi | H04B 1/525 |
| | | | 455/78 |
| 2016/0191020 A1* | 6/2016 | Velazquez | H03F 1/3247 |
| | | | 341/118 |
| 2017/0244582 A1* | 8/2017 | Gal | H04L 25/03885 |
| 2019/0103930 A1* | 4/2019 | Jiang | H04B 1/525 |

* cited by examiner

METHOD AND APPARATUS FOR CANCELLING FRONT-END DISTORTION

CROSS REFERENCE TO RELATED APPLICATION

This disclosure claims the benefit of commonly-assigned U.S. Provisional Patent Application No. 63/224,276, filed Jul. 21, 2021, which is hereby incorporated by reference herein in its entirety.

FIELD OF USE

This disclosure relates to distortion cancellation on a communication channel. More particularly, this disclosure relates to the cancellation, at the front end, of distortion introduced during front-end processing of signals received from, or being transmitted to, a channel medium.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

As signal throughput in systems and integrated circuits (ICs)—including but not limited to parallel computing, analog-to-digital conversion (ADC), digital-to-analog conversion (DAC), optical devices, and serializer/de-serializers (SERDES), or any communication system where a signal is transmitted and received through a channel medium—increases to meet bandwidth demand, distortion increasingly becomes a practical limit to performance in many applications. Examples of this type of limitation include, among others, image distortion in video transmission, and constellation distortion in single- or multi-carrier/multi-modulation signal transmission applications such as Optical Coherent Detection and SerDes Direct Detection. Ultimately, these limitations cause a deterministic increase in bit-error-rate (BER) that should be minimized to further approach Shannon channel limits.

SUMMARY

In accordance with implementations of the subject matter of this disclosure, transceiver circuitry in an integrated circuit device includes a receive path including an analog front end configured to receive analog signals from an analog transmission path and to condition the analog signals, and an analog-to-digital converter configured to convert the conditioned analog signals into received digital signals for delivery to functional circuitry of the integrated circuit device, and a transmit path including a digital front end configured to accept digital signals from the functional circuitry and to condition the accepted digital signals, and a digital-to-analog converter configured to convert the conditioned digital signals into transmission analog signals for transmission onto the analog transmission path, where at least one of the analog front end and the digital front end introduces distortion during signal conditioning and outputs a distorted conditioned signal, and the transceiver circuitry further includes distortion correction circuitry at the one of the analog front end and the digital front end, the distortion correction circuitry being configured to determine and apply a distortion cancellation function to cancel a distortion component from the distorted conditioned signal.

In a first implementation of such transceiver circuitry, the distortion correction circuitry may be configured to determine, as the distortion cancellation function, a digital inversion of the distortion, and to apply the digital inversion to the conditioned signal.

According to a first aspect of that first implementation, the distortion correction circuitry may be configured to determine the digital inversion as a superposition of inversion functions.

In a first instance of that first aspect, the distortion correction circuitry may include matrix operator circuitry to compute the superposition of inversion functions.

In a first variant of that first instance, the matrix operator circuitry may include matrix multipliers and matrix adders.

In a second variant of that first instance, the matrix operator circuitry may further include a look-up table for trigonometric operations.

In a second implementation of such transceiver circuitry, the distortion correction circuitry may be configured to determine and apply, as the distortion cancellation function, a polynomial representation including at least one term that subtracts a distortion correction from the distorted conditioned signal.

According to a first aspect of that second implementation, the distortion correction circuitry may be configured to determine and apply a symmetrical polynomial approximation centered on an inflection point of the distorted conditioned signal.

In a first instance of that first aspect, the distortion correction circuitry may be configured to break up the distorted conditioned signal into a plurality of respective symmetrical segments centered on respective inflection points of the distorted conditioned signal and to determine and apply respective symmetrical polynomial approximations to the respective symmetrical segments.

A first variant of that first instance may include a successive-approximation-register analog-to-digital converter for determining the polynomial approximations.

A second variant of that first instance may include a digital multiplexer controlled by a sparsely-populated matrix for determining the polynomial approximations.

In accordance with implementations of the subject matter of this disclosure, for use in transceiver circuitry in an integrated circuit device, the transceiver circuitry including comprising a receive path including an analog front end configured to receive analog signals from an analog transmission path and to condition the analog signals, and an analog-to-digital converter configured to convert the conditioned analog signals into received digital signals for delivery to functional circuitry of the integrated circuit device, and a transmit path including a digital front end configured to accept digital signals from the functional circuitry and to condition the accepted digital signals, and a digital-to-analog converter configured to convert the conditioned digital signals into transmission analog signals for transmission onto the analog transmission path, where at least one of the analog front end and the digital front end introduces distortion during signal conditioning and outputs a distorted conditioned signal, a method for correcting the distorted conditioned signal includes determining, at the at least one of the analog front end and the digital front end, a distortion cancellation function, and applying the distortion cancellation function to cancel a distortion component from the distorted conditioned signal.

A first implementation of such a method may include determining, using circuitry, as the distortion cancellation function, a digital inversion of the distortion.

A first aspect of that first implementation may include determining, using circuitry, the digital inversion as a superposition of inversion functions.

In a first instance of that first aspect, determining, using circuitry, the digital inversion as a superposition of inversion functions may include performing matrix operations.

A variant of that first instance may further include performing, using circuitry, trigonometric operations.

A second implementation of such a method may include determining, using circuitry, as the distortion cancellation function, a polynomial representation including at least one term that subtracts a distortion correction from the distorted conditioned signal.

According to a first aspect of that second implementation, determining the polynomial representation of the distortion correction may include determining a symmetrical polynomial approximation centered on an inflection point of the distorted conditioned signal.

A first instance of that first aspect may further include breaking up the distorted conditioned signal, using circuitry, into a plurality of respective symmetrical segments centered on respective inflection points of the distorted conditioned signal and determining and applying, using circuitry, respective symmetrical polynomial approximations to the respective symmetrical segments.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
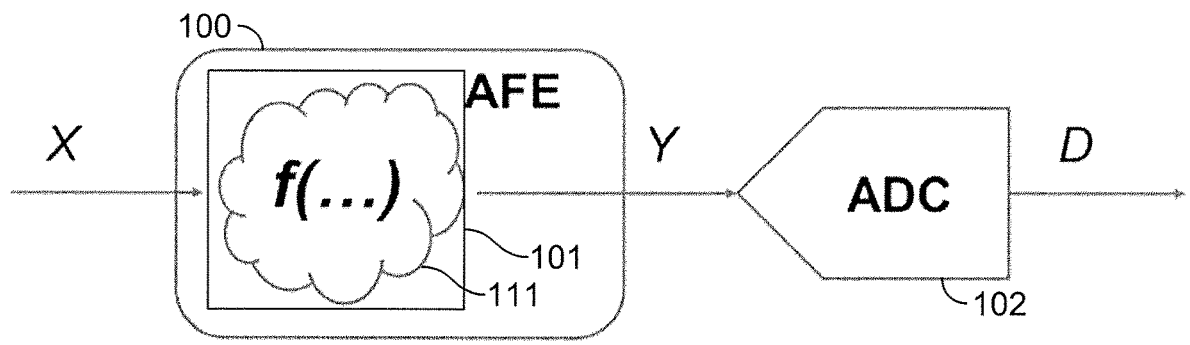
FIG. 1 shows an analog front-end of a transceiver with which implementations of the subject matter of this disclosure may be used.

An analog front-end (AFE) 100 of a transceiver with which implementations of the subject matter of this disclosure may be used is shown in FIG. 1. AFE 100 may include various forms of conditioning circuitry 101 (e.g., filtering and/or equalization circuitry) that introduces an arbitrary distortion function 111 (based, e.g., on the particular structure of filtering and/or equalization circuitry 101). Distortion function 111 may act on an otherwise "clean" analog input signal X to produce an analog distorted output Y that is then quantized by an analog-to-digital converter (ADC) 102 to yield a distorted quantized signal D. In typical systems, the distortion may be filtered downstream in further circuitry using a filter such as a finite impulse response (FIR) filter or an infinite impulse response (IIR) filter, which may not remove all of the distortion.

Figure 2:
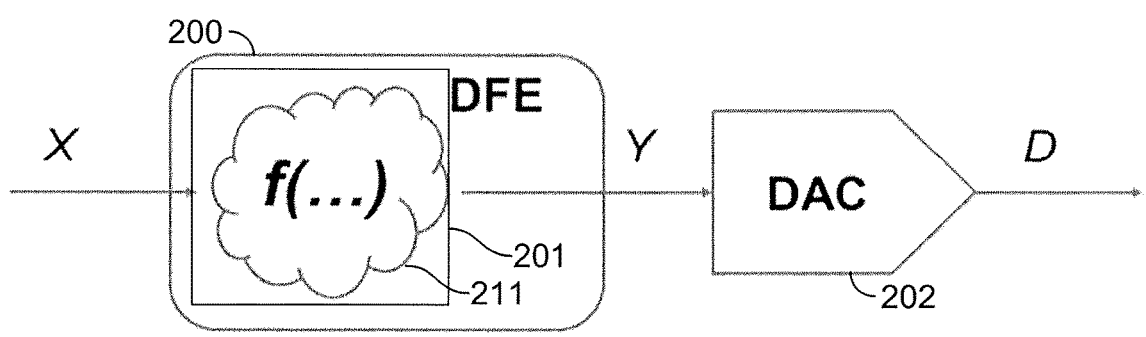
FIG. 2 shows a digital front-end of a transceiver with which implementations of the subject matter of this disclosure may be used.

A digital front-end (DFE) 200 of a transceiver with which implementations of the subject matter of this disclosure may be used is shown in FIG. 2. DFE 200 may include various forms of filtering and/or equalization circuitry 201 that may unintentionally introduce an arbitrary distortion function 211 (based on the particular structure of filtering and/or equalization circuitry 201). Distortion function 211 may act on an otherwise "clean" input digital signal X is digital, distorting the signal X which is converted to a final distorted analog output D by a digital-to-analog converter (DAC). In typical systems, the distortion may be filtered downstream in further circuitry using a filter such as a finite impulse response (FIR) filter or an infinite impulse response IIR) filter, which may not remove all of the distortion.

In either case, distortion function 111/211—whether in case of quantization (ADC) or de-quantization (DAC)—may be modelled as a composite distortion effect including an error term $\varepsilon_q$ and a noise term $\varepsilon_n$. Noise term $\varepsilon_n$ may include all types of noise sources as long as they approximately either (1) approach the additive nature of random noise, or (2) act uniformly on input signal X regardless of its statistics (e.g. amplitude, frequency, etc.), the term "approximate" or "approximately" describes a weak condition that is met at least sufficiently to the performance level that affects the system. Examples of such noise sources are thermal noise, quantization, flicker noise, channel noise, numerical noise in digital systems, etc. Expressing this relationship in equation format and allow the parameters of interest to take the form of generalized tensors of arbitrary dimensions (in bold), yields:

$$D = f_{noiseless}(X) + \varepsilon_q + \varepsilon_n = f(X) \quad \text{(Eq. 1)}$$

where all error and noise terms are included in a generalized function $f(X)$.

One can define $\hat{D}$ as the ideal system output without distortion effects, and a distortion error term E. Ideal output $\hat{D}$ may be computed from the distorted output D as follows:

$$E = D - \hat{D} = f(\hat{D}) - \hat{D} \quad \text{(Eq. 2a)}$$

$$\hat{D} \cong g(D) \cong \hat{f}^{-1}(D) \quad \text{(Eq. 2b)}$$

$$\hat{D} = D - E \quad \text{(Eq. 2c)}$$

Eq. 2b and Eq. 2c represent two implementations for identifying and removing a distortion component to compute the clean or undistorted output $\hat{D}$ from the distorted output D. First, one can apply an approximate inverse function to D (Eq. 2b). Alternatively, one can subtract out the distortion error term E from the distorted output D (Eq. 2c).

In an inverse function implementation, the function $g(\ldots)$ may be defined as a function that best approximates a pseudo inverse function $\hat{f}^{-1}(\ldots)$ of $f(\ldots)$ that would cancel out the targeted distortion effects. Such a function is consider an approximate, or "pseudo" function because it may not be possible to invert all distortion effects. The pseudo inversion function or operation is one that best approximates true inversion with the smallest error possible (e.g., least square error is minimized).

Digital inversion may be performed in some implementations by a superposition of "expert" functions. That is, a weighted superposition of a family of "expert" functions that best approximates the cause of signal distortion may be determined as follows:

First, a family of inversion functions that best approximate the distortion characteristics ($h_0 \ldots h_{n-1}$) or distortion error characteristics ($l_0 \ldots l_{n-1}$) is chosen.

Second, given the distorted system output D, one can approximate the clean output $\hat{D}$ or error term E using:

$$\hat{D} \cong \begin{bmatrix} \hat{D}(t_0) \\ \vdots \\ \hat{D}(t_{k-1}) \end{bmatrix} \cong \quad \text{(Eq. 3a)}$$

$$\begin{bmatrix} 1 & h_0[D(t_0)] & \cdots & h_{n-2}[D(t_0)] & h_{n-1}[D(t_0)] \\ \vdots & \vdots & \ddots & \vdots & \vdots \\ 1 & h_0[D(t_k)] & \cdots & h_{n-2}[D(t_{k-1})] & h_{n-1}[D(t_{k-1})] \end{bmatrix} \begin{bmatrix} \alpha_0 \\ \vdots \\ \alpha_{n-1} \end{bmatrix} = H_D * \alpha$$

$$\hat{D} \cong [1 \; h_0(D) \; \cdots \; h_{n-2}(D) \; h_{n-1}(D) ] * \begin{bmatrix} \alpha_0 \\ \vdots \\ \alpha_{n-1} \end{bmatrix} = H_D * \alpha \quad \text{(Eq. 3b)}$$

$$E \cong \begin{bmatrix} E(t_0) \\ \vdots \\ E(t_{k-1}) \end{bmatrix} \cong \begin{bmatrix} 1 & l_0[D(t_0)] & \cdots & l_{n-2}[D(t_0)] & l_{n-1}[D(t_0)] \\ \vdots & \vdots & \ddots & \vdots & \vdots \\ 1 & l_0[D(t_k)] & \cdots & l_{n-2}[D(t_{k-1})] & l_{n-1}[D(t_{k-1})] \end{bmatrix} \quad \text{(Eq. 4a)}$$

$$\begin{bmatrix} \beta_0 \\ \vdots \\ \beta_{n-1} \end{bmatrix} = L_D * \beta$$

$$E \cong [1 \; l_0(D) \; \cdots \; l_{n-2}(D) \; l_{n-1}(D) ] * \begin{bmatrix} \beta_0 \\ \vdots \\ \beta_{n-1} \end{bmatrix} = L_D * \beta \quad \text{(Eq. 4b)}$$

where $H_D$ or $L_D$ is the system output filtered by the chosen family of expert functions.

Third, a weighting vector (i.e., scaling matrix) $\alpha$ or $\beta$ may be determined (e.g. via least square methods for over-determined problems) with a known input-to-output pair $E_{known}$-to-$D_{known}$ or $\hat{D}_{known}$-to-$D_{known}$:

$$\alpha = \tilde{H}_D^{-1} * \hat{D}_{known} \text{ where } \tilde{H}_D^{-1} \text{ is the pseudo inverse of } H_D \quad \text{(Eq. 5a)}$$

$$\beta = \tilde{L}_D^{-1} * \hat{D}_{known} \text{ where } \tilde{L}_D^{-1} \text{ is the pseudo inverse of } L_D \quad \text{(Eq. 5b)}$$

Fourth, once $\alpha$ or $\beta$ has been determined, for any new system output D, compute $\hat{D}$ may be computed using Eq. 3b or Eqs. 2c/4b to remove distortion.

The alternatives ("or") in the foregoing method signify a choice that imposes a minimized computational burden on the system (e.g., error signals tend to require less bit width in adders or multipliers, as compared to the full signal content that typically has much more complexity and a larger dynamic range).

As one illustrative implementation, in high-speed IC receivers with harmonic distortion, the system output typically includes the input and its harmonics and thus can be modelled as a polynomial series of the input signal X plus noise $\varepsilon_n$ and quantization error $\varepsilon_q$:

$$D = \alpha_0 + \alpha_1 X + \alpha_2 X^2 + \alpha_3 X^3 + \ldots + \alpha_{n-1} X^{n-1} + \varepsilon_n + \varepsilon_q = f(X) \quad \text{(Eq. 6)}$$

Figure 3:
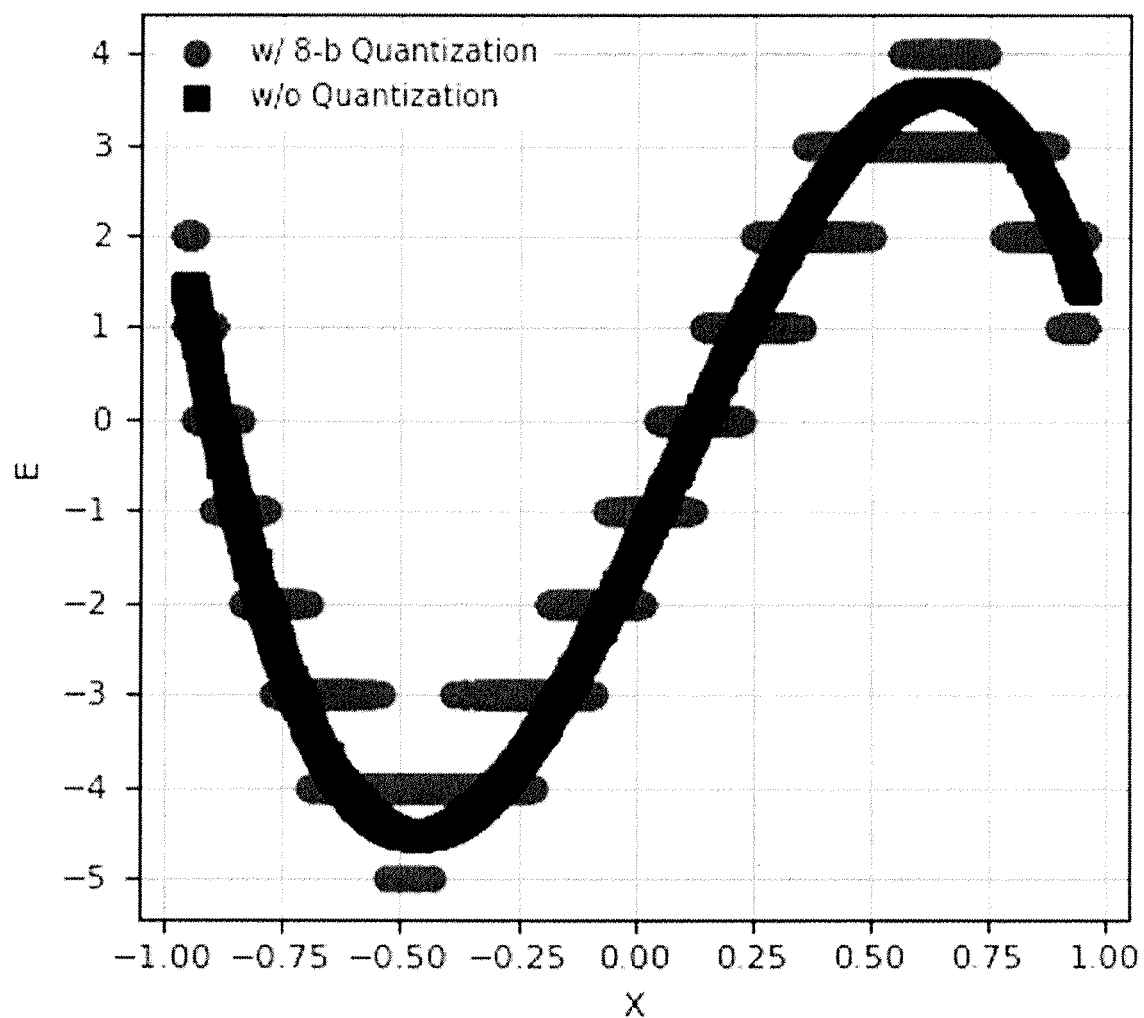
FIG. 3 is a plot of an error pattern illustrating an aspect of the subject matter of this disclosure.

For example, considering a fourth-order polynomial system with 7-bit noise and 8-bit quantization (n=4), such a system may be assumed to have only second- and third-order harmonic distortions (HD2 and HD3) acting on its input X (e.g. $\alpha_2 = 0.02$, $\alpha_3 = 0.07$, and $\alpha_i = 0$ for i>3, where $\alpha_0$ and $\alpha_1$ are system offset and linear gain from input to output. The relationship of the error signal E to X (assuming a full range of ±1) based on Eq. 2a can be computed using a known input-to-output pattern X-to-$\hat{D}$, as shown in FIG. 3, where the error E is plotted for two cases, with and without 8-bit quantization effects (tones are shown in both dB and bits).

Figure 4:
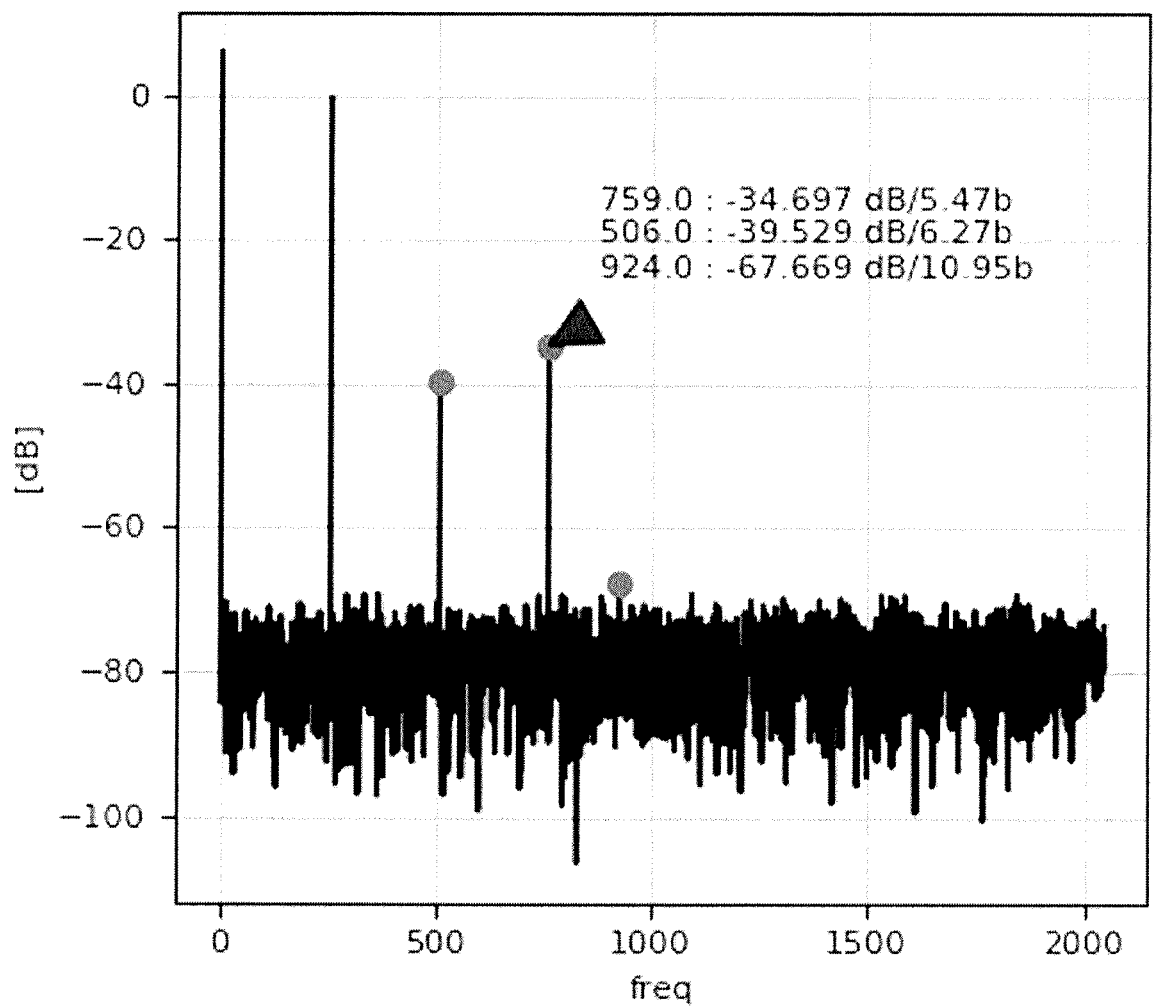
FIG. 4 shows the Fourier spectrum of a distorted signal based on an applied sinusoidal input.

Similarly, FIG. 4 shows a 4096-point output Fourier spectrum with distortion effects based on an applied sinusoidal input X. The spectrum is normalized to its output fundamental tone (i.e., fundamental tone is 0 dB at bin 253). As can be seen, the distortion effects manifest as HD2 and HD3 tones of −34.7 dB and −39.5 dB, respectively, corresponding to values of $\alpha_2 = 0.02$ and $\alpha_3 = 0.07$ in Eq. 6.

As a further illustration, two distinct families of expert functions may be compared—a fourth-order polynomial series, and a mix of linear and sinusoidal functions, as follows:

$$E \cong [1 D \; D^2 D^3] * \beta = \quad \text{(Eq. 7a)}$$

$$E \cong [1 D \; \sin(D) \; \cos(D)] * \beta = \quad \text{(Eq. 7b)}$$

Figure 5:
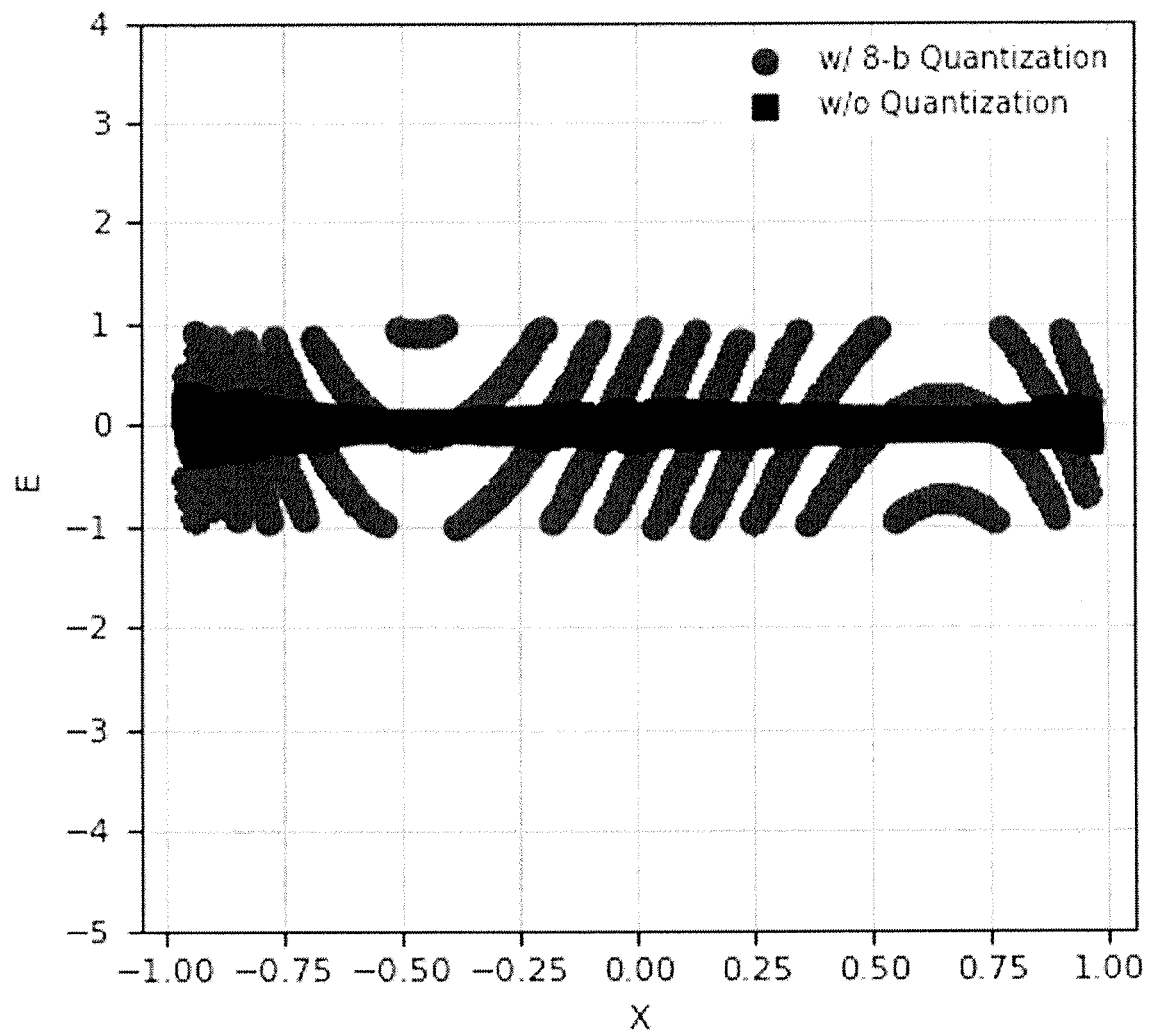
FIG. 5 shows a distortion-compensated error signal in accordance with one implementation of subject matter of this disclosure.
Figure 6:
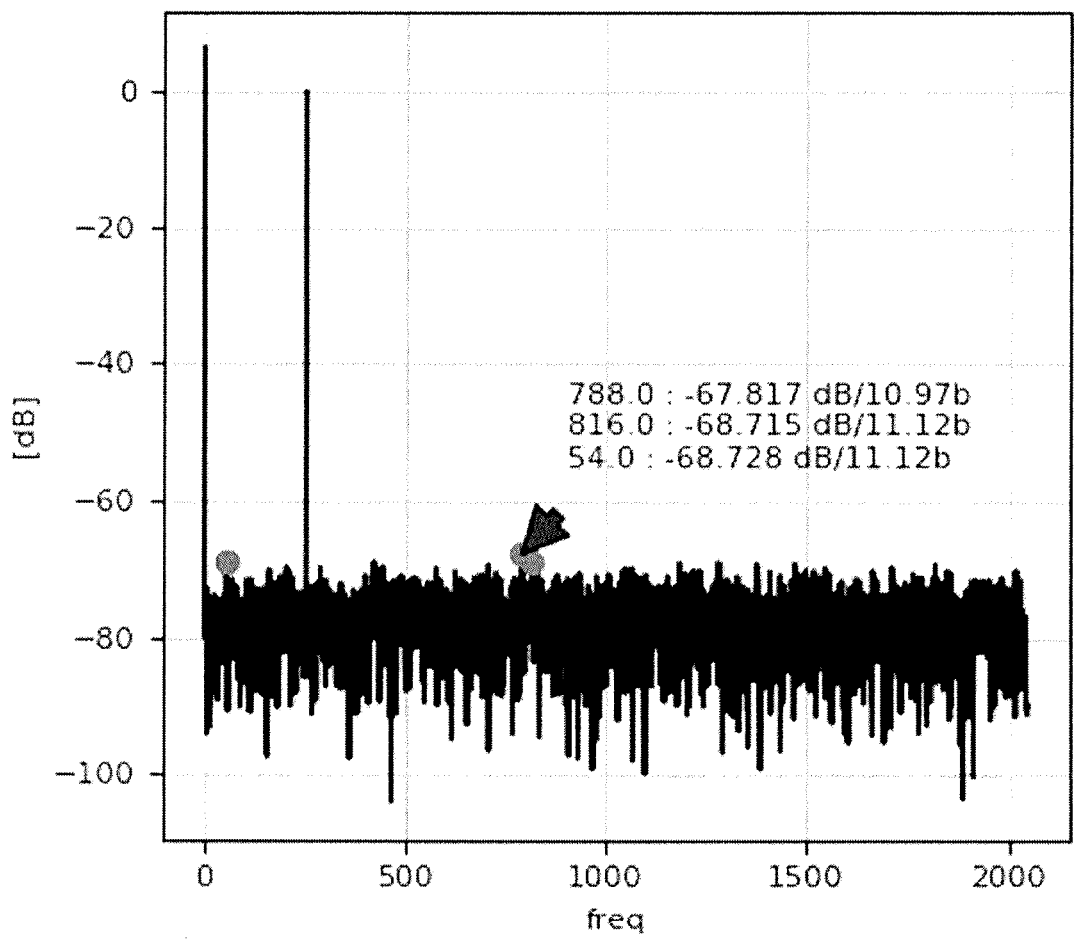
FIG. 6 shows an output spectrum in accordance with an implementation of the subject matter of this disclosure.
Figure 7:
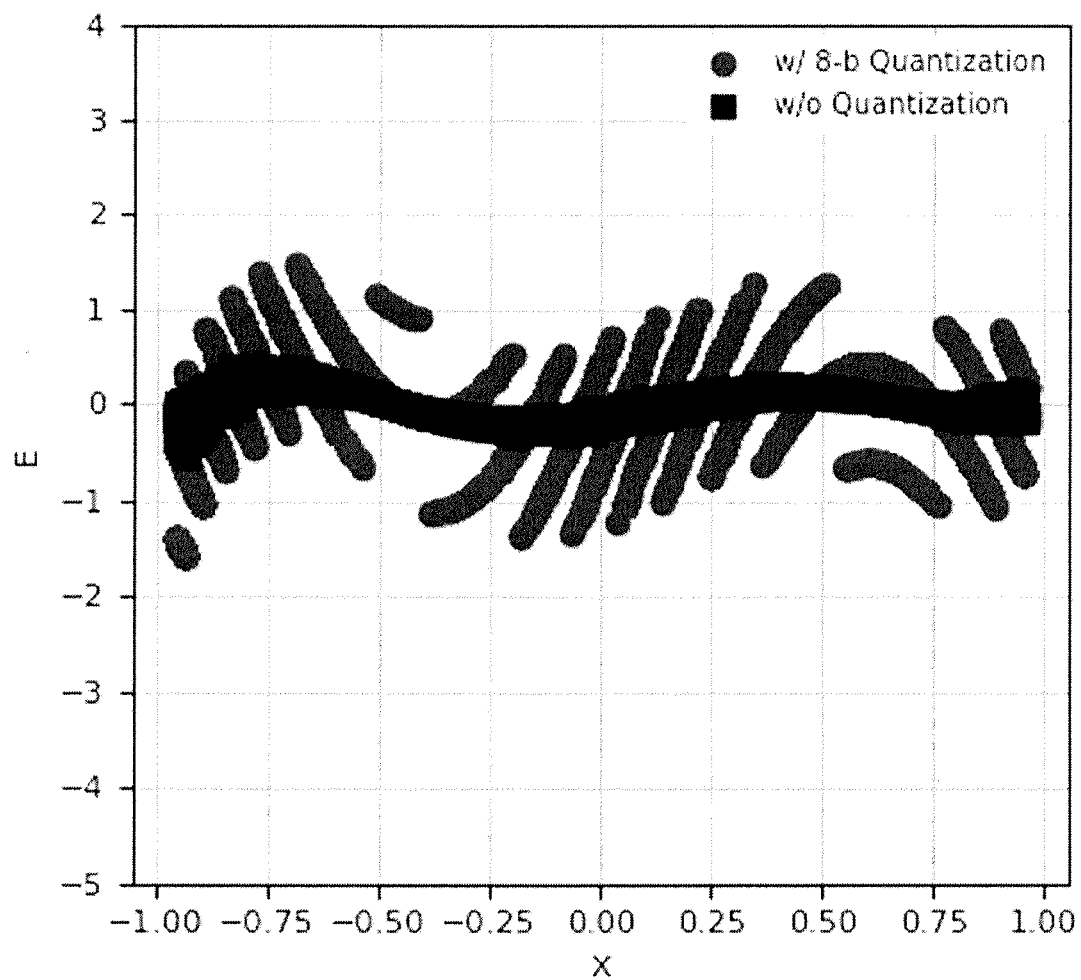
FIG. 7 shows distortion compensated error signals in accordance with an implementation of the subject matter of this disclosure.
Figure 8:
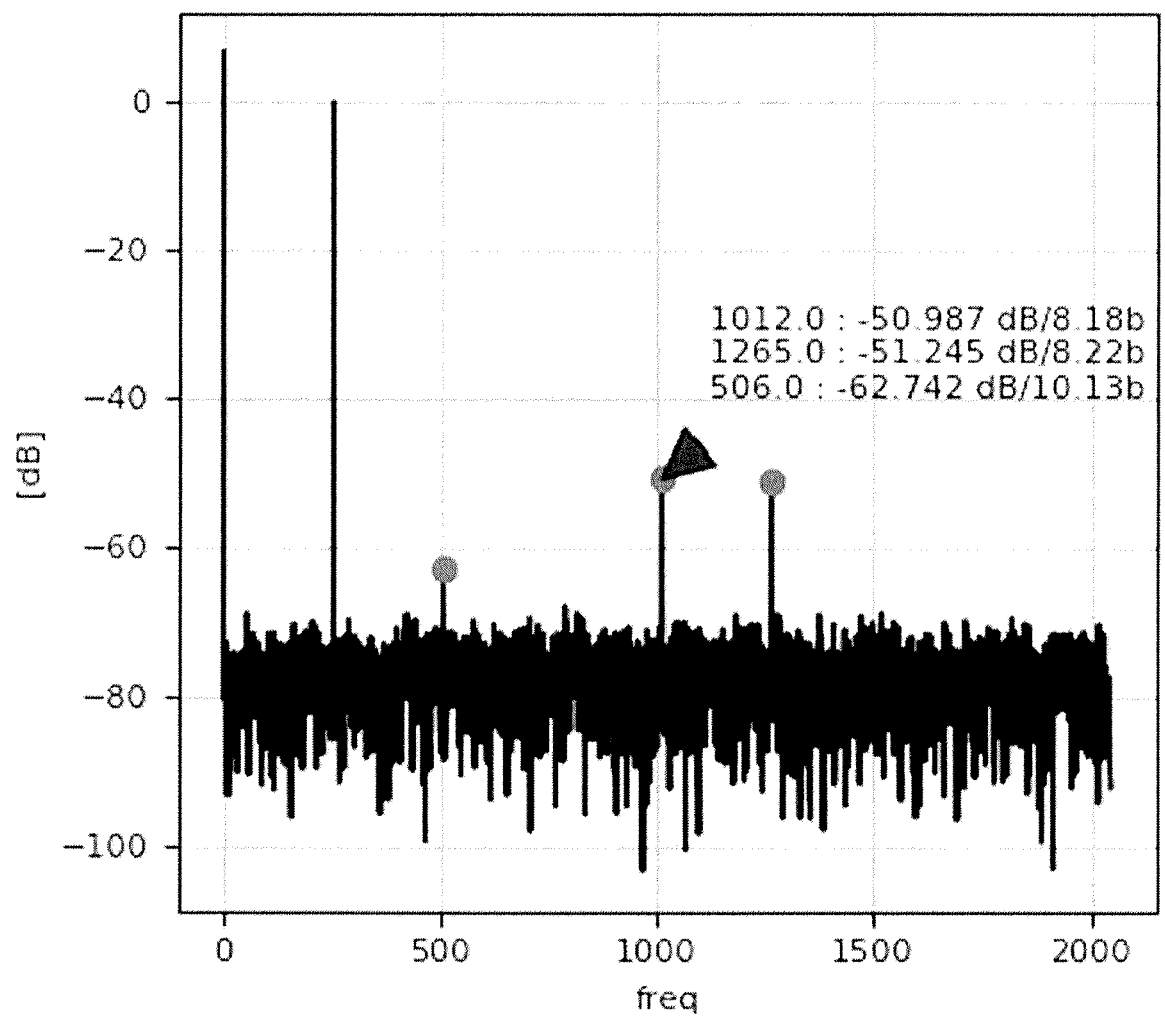
FIG. 8 shows an output spectrum in accordance with an implementation of the subject matter of this disclosure.

Solving for $\beta$ as above using Eq. 5b, and applying Eq. 3b or Eqs. 2c/4b to new sinusoidal inputs, Eq. 7a yields the distortion-compensated error signal of FIG. 5 and the output spectrum of FIG. 6, while Eq. 7b yields the distortion compensated error signals of FIG. 7 and the output spectrum of FIG. 8.

Figure 9:
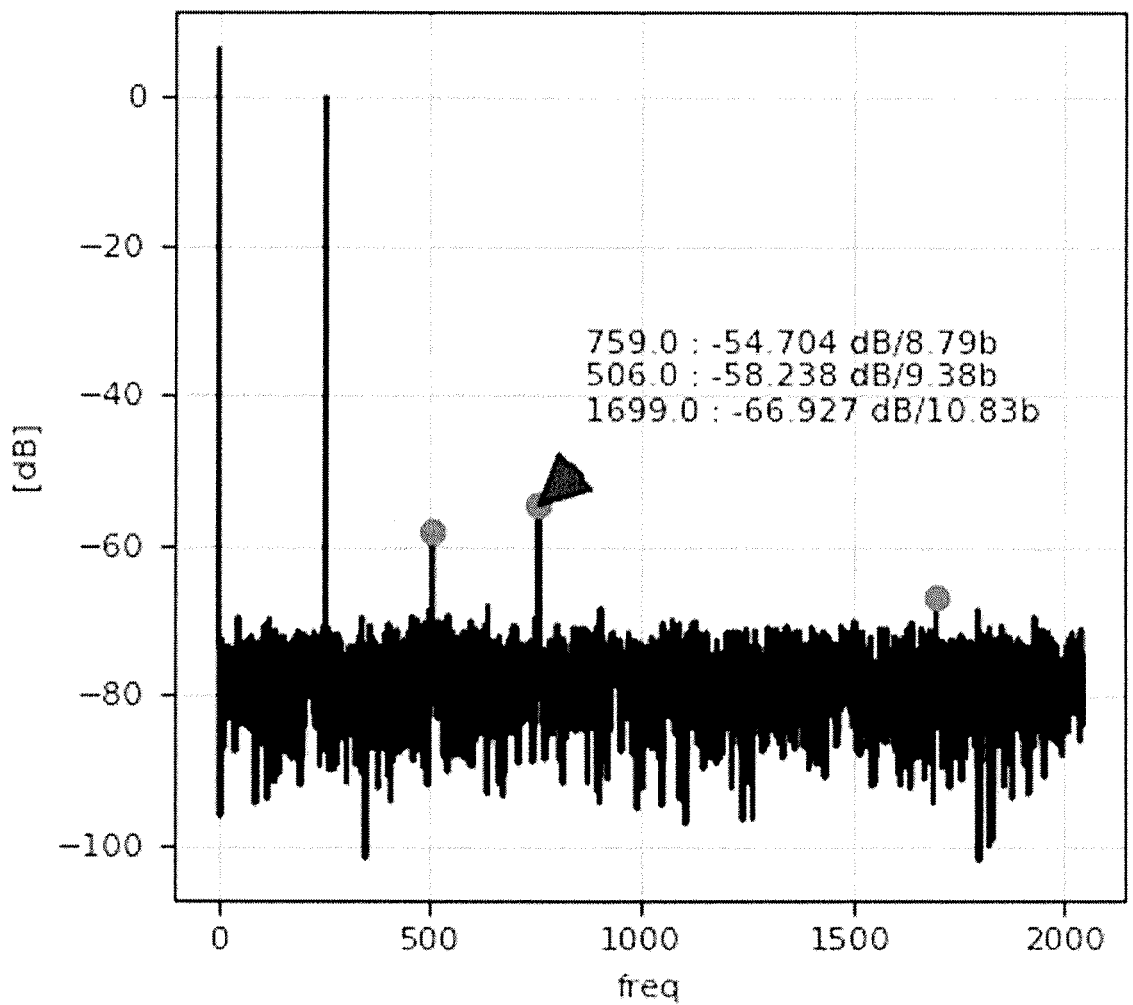
FIG. 9 shows an output spectrum in accordance with an implementation of the subject matter of this disclosure.
Figure 10:
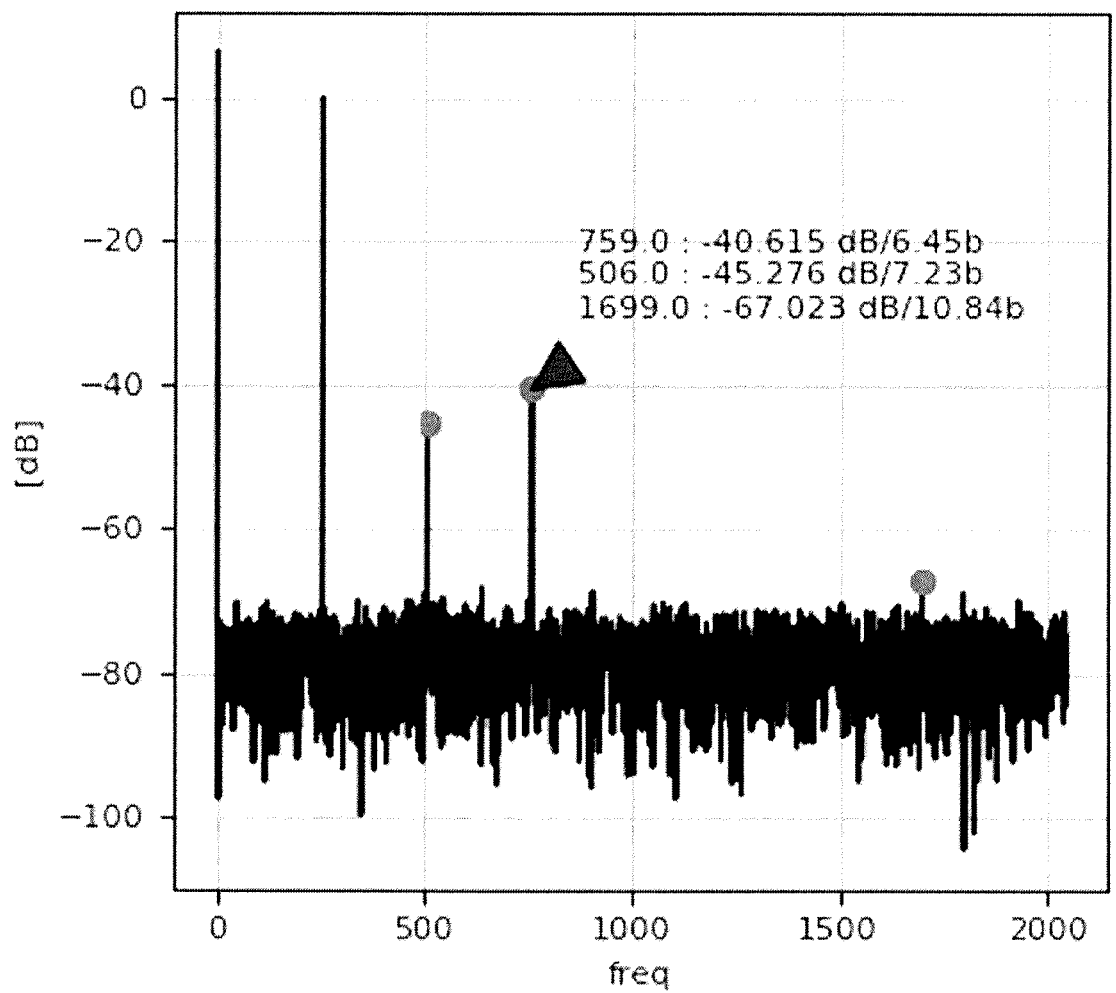
FIG. 10 shows an output spectrum in accordance with an implementation of the subject matter of this disclosure.

As can be seen, using digital inversion with proper choices of expert functions, HD2 and HD3 tones can be eliminated completely. In this illustration, the choice of Eq. 7a yields better results than Eq. 7b because it is a better match to the nature of the system distortion (i.e., polynomials). In particular, Eq. 7a reduces both HD2 and HD3 to below spectrum noise level whereas Eq. 7b only suppresses the original distortion by ~28 dB. Remaining residual distortion errors after cancellation are due to both quantization limitations and the choices of family functions $h_0 \ldots h_3$. However, exact cancellation is not needed as long as the cancellation direction is correct. For example, even when partial cancellation is performed, partial tonal improvement can still be obtained. Two examples shown in FIGS. 9 and 10 below with the above-defined weighting vector $\beta$ reduced by 10% or 50% still yield 20 dB and 6 dB distortion suppression, respectively.

The hardware requirements for expert function implementations include full matrix multiplication and addition to realize expert functions $h_0 \ldots h_{n-1}$ or $l_0 \ldots l_{n-1}$, as well as additional resolution to drive residual cancellation errors to below a noise level (e.g., 7-bit noise for 8-bit quantization). For example, implementing Eq. 7a may require full 24-bit adders and 24-bit multipliers (with several margin bits to prevent overflow) that constantly run at the full system data rate. This can be costly in practice in terms of both power and area for some applications.

On the other hand, though less precise in distortion cancellation, Eq. 7b requires an 8-bit look-up table (LUT) for sine and cosine operation), but only 8-bit multipliers and 8-bit adders (plus margin bits), and therefore may be less costly in practice.

Figure 11:
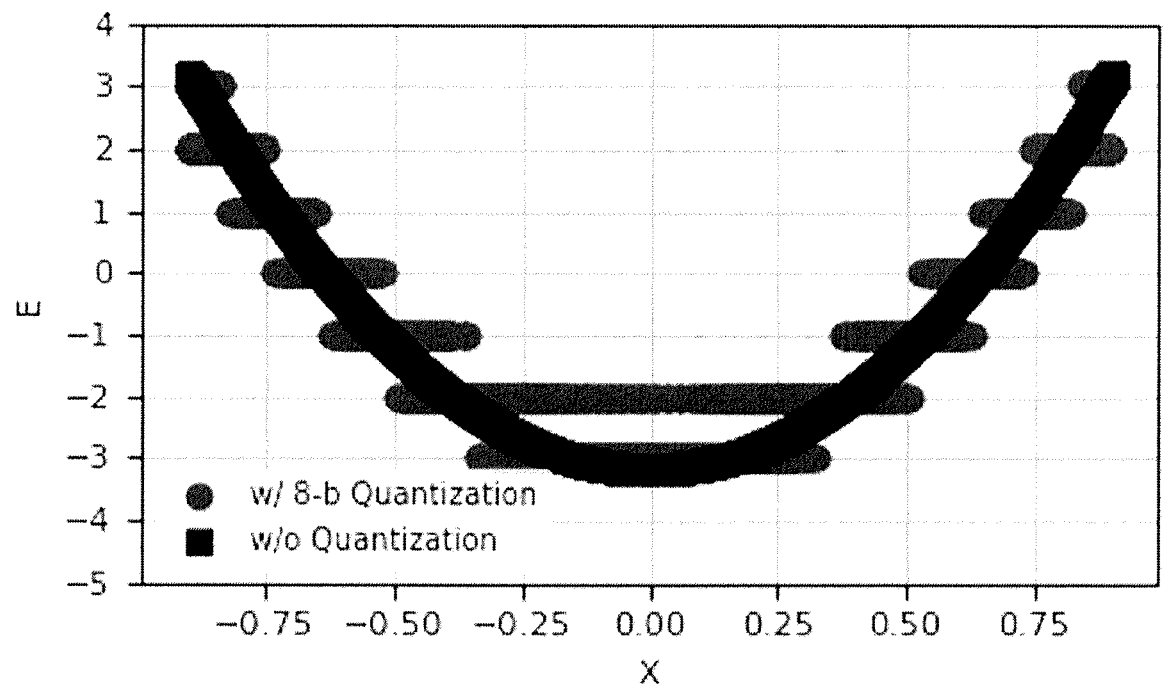
FIG. 11 shows an example of harmonic distortion which may be corrected accordance with an implementation of the subject matter of this disclosure.
Figure 12:
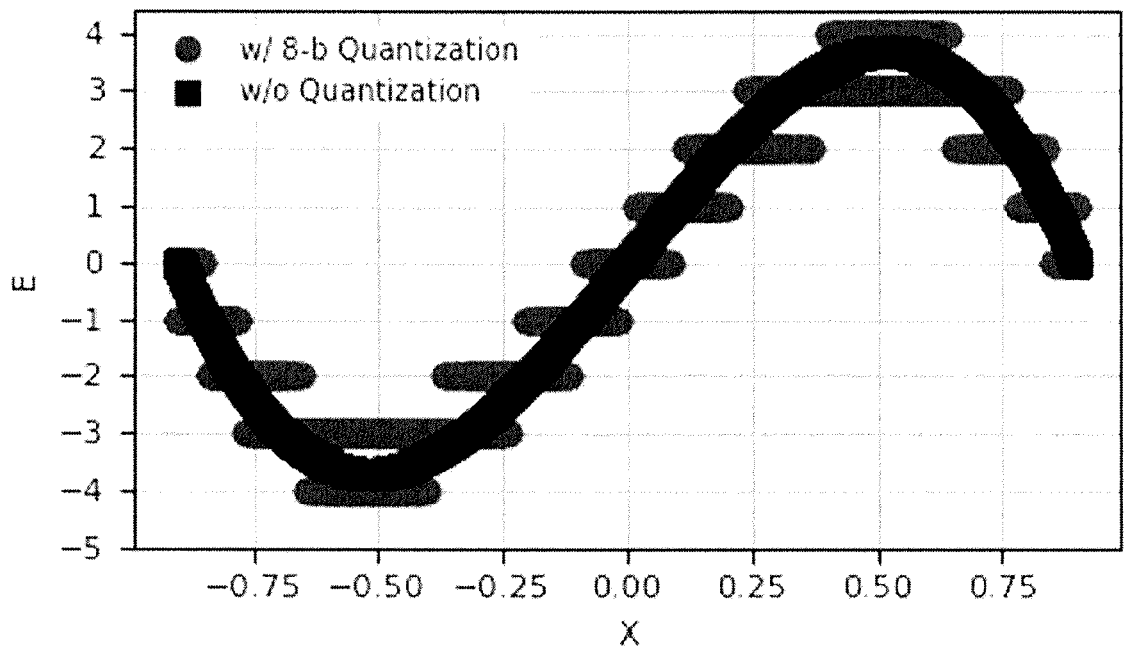
FIG. 12 shows an example of harmonic distortion which may be corrected in accordance with an implementation of the subject matter of this disclosure.

In other implementations involving cases where the distortion has certain types of symmetry, polynomial distortion compensation may be used. These implementations may compensate for many practical distortion effects using a more efficient implementation. For example, harmonic second- and third-order distortions (HD2 and HD3) may manifest as the error shapes shown in FIGS. 11 and 12, respectively. Higher harmonic distortion orders (e.g. fourth-order, fifth-order, etc.) also have similar symmetry, where the points of symmetry center around binary focal points (e.g. 0, ±½, ±¼, ±⅛, etc.) on the abscissa.

This symmetry allows the use of binary-type conversion applications such Successive-Approximation-Register (SAR) ADC for efficient cancellation of distortion. In SAR ADC, each bit naturally targets the binary focal points in the error transfer function. Polynomial distortion errors can be approximated by linear shapes centered symmetrically around the binary focal points, where going from the most significant bit (MSB) to least significant bit (LSB) is equivalent to moving from one focal point to the next (0, ±½, ±¼, etc.).

It can be shown mathematically that the following equations describe the approximate inverse needed to cancel out most practical HD2 & HD3 distortions:

$$D_c = \begin{bmatrix} D_{MSB} \\ D_{MSB-1} \\ D_{MSB-2} \\ \vdots \\ D_{i3} \\ \vdots \\ D_{i2} \\ \vdots \end{bmatrix} = \qquad \text{(Eq. 7)}$$

$$\begin{bmatrix} (-1)^{S_2} \\ (-1)^{1+S_3+B_{MSB}} \\ (-1)^{-1+S_2+B_{MSB}+B_{MSB-1}} \\ \vdots \\ (-1)^{S_3+B_{MSB}+B_{MSB-1}+B_{i+1}} \\ \vdots \\ (-1)^{1+S_2+B_{MSB}+B_{i+1}} \\ \vdots \end{bmatrix} \times \begin{bmatrix} W_{MSB} \\ W_{MSB-1} \\ W_{MSB-2} \\ \vdots \\ W_{i3} \\ \vdots \\ W_{i2} \\ \vdots \end{bmatrix} = (-1)^{D_p^{THD}} \times W$$

where:
$D_i$ denotes the error signal to be injected at binary focal point i;
$W_i$ denotes the optimization weight;
$S_2$ and $S_3$ are curvature signs of HD2 and HD3;
$B_i$ denotes the next signal direction or bit decision at point i;
i2,i3 denote indices specific to HD2,HD3 cancellation;
× denotes an element-wise multiplication operation; and
$D_p^{THD}$ and W denote exponent and weight tensors.

Breaking out the exponent of the above middle tensor into expanded form as $$D_p^{THD} = \begin{bmatrix} d_{MSB} \\ d_{MSB-1} \\ d_{MSB-2} \\ \vdots \\ d_{i3} \\ \vdots \\ d_{i2} \\ \vdots \\ d_{i2\_last} \end{bmatrix} = \qquad \text{(Eq. 8a)}$$

$$\begin{bmatrix} 1 & 0 & 0 & 0 & \ldots & 0 & \ldots & 0 & \ldots & 0 \\ 0 & 1 & 0 & 0 & \ldots & 0 & \ldots & 0 & \ldots & 0 \\ 1 & 1 & 1 & 0 & \ldots & 0 & \ldots & 0 & \ldots & 0 \\ \vdots & \vdots & \vdots & \vdots & \ddots & \vdots & \ddots & \vdots & \ddots & \vdots \\ 0 & 1 & 1 & 0 & \ldots & 1 & \ldots & 0 & \ldots & 0 \\ \vdots & \vdots & \vdots & \vdots & \ddots & \vdots & \ddots & \vdots & \ddots & \vdots \\ 1 & 1 & 0 & 0 & \ldots & 0 & \ldots & 1 & \ldots & 0 \\ \vdots & \vdots & \vdots & \vdots & \ldots & \vdots & \ddots & \vdots & \ddots & \vdots \\ \vdots & \vdots & \vdots & \vdots & \ldots & \vdots & \ldots & \vdots & \ldots & 1 \end{bmatrix} \begin{bmatrix} S_2 \\ B_{MSB} \\ B_{MSB-1} \\ \vdots \\ B_{i+1} \\ \vdots \\ B_{i+1} \\ \vdots \\ B_{i2\_last+1} \end{bmatrix} + \begin{bmatrix} 0 \\ 1+S_3 \\ 1 \\ \vdots \\ S_3 \\ \vdots \\ 1 \\ \vdots \\ 1 \end{bmatrix}$$

Thus, for N input samples:

$$D_p^{THD} = \begin{bmatrix} 1 & 0 & 0 & 0 & \ldots & 0 & \ldots & 0 & \ldots & 0 \\ 0 & 1 & 0 & 0 & \ldots & 0 & \ldots & 0 & \ldots & 0 \\ 1 & 1 & 1 & 0 & \ldots & 0 & \ldots & 0 & \ldots & 0 \\ \vdots & \vdots & \vdots & \vdots & \ddots & \vdots & \ddots & \vdots & \ddots & \vdots \\ 0 & 1 & 1 & 0 & \ldots & 1 & \ldots & 0 & \ldots & 0 \\ \vdots & \vdots & \vdots & \vdots & \ddots & \vdots & \ddots & \vdots & \ddots & \vdots \\ 1 & 1 & 0 & 0 & \ldots & 0 & \ldots & 1 & \ldots & 0 \\ \vdots & \vdots & \vdots & \vdots & \ldots & \vdots & \ddots & \vdots & \ddots & \vdots \\ \vdots & \vdots & \vdots & \vdots & \ldots & \vdots & \ldots & \vdots & \ldots & 1 \end{bmatrix} \qquad \text{(Eq. 8b)}$$

$$\begin{bmatrix} \ldots & S_2 & \ldots \\ \ldots & B_{MSB}[n] & \ldots \\ \ldots & B_{MSB-1}[n] & \ldots \\ \ldots & \vdots & \ldots \\ \ldots & B_{i+1}[n] & \ldots \\ \ldots & \vdots & \ldots \\ \ldots & B_{i+1}[n] & \ldots \\ \ldots & \vdots & \ldots \\ \ldots & B_{i2\_last+1}[n] & \ldots \end{bmatrix} + \begin{bmatrix} 0 \\ 1+S_3 \\ 1 \\ \vdots \\ S_3 \\ \vdots \\ 1 \\ \vdots \\ 1 \end{bmatrix}$$

where index n denotes the $n^{th}$ data point or data at time n ($0 \leq n < N$)

Rewriting in compact tensor format for multiple inputs:

$$D_p^{(K2+K3-2) \times N} = M^{(K2+K3-2) \times (K2+K3-2)} * B^{(K2+K3-2) \times N} + S^{(K2+K3-2) \times 1} \qquad \text{(Eq. 9a)}$$

where K2,K3 denote the number of bits or rows allocated to HD2,HD3 compensation.

Combining Eq. 7 and Eq. 9a:

$$D_c = (-1)^{(M*B+S)^T} * W = (-1)^{D_p^T} * W = E * W \text{ where } E = (-1)^{D_p^T} \qquad \text{(Eq. 9b)}$$

Solving Eq. 9b for the ideal weight vector:

$$W_{opt} = (E^T * E)^{-1} * E^T * D_c \qquad \text{(Eq. 10)}$$

where matrix inversion is required to solve for $W_{opt}$. In scenarios where inversion is not possible, pseudo-inversion with training or least square methods may be sufficient for a best approximation. From here, the ideal cancellation vector $D_{c\_opt}$ and compensated output $D_{fixed}$ can be computed as:

$$D_{c\_opt} \cong E * W_{opt} \quad \text{(Eq. 11a)}$$

$$D_{fixed} \cong D - D_c \quad \text{(Eq. 11b)}$$

Considering again harmonic distortion as described above in connection with Eq. 6 through Eq. 7b, and allocating K2=K3=6 bits of distortion cancellation for both HD2 and HD3, Eq. 8b can be rewritten as $$D_{p\_6bits}^{THD} = \begin{bmatrix} 1 & 0 & 0 & 0 & 0 & 0 & 0 & 0 & 0 \\ 0 & 1 & 0 & 0 & 0 & 0 & 0 & 0 & 0 \\ 1 & 1 & 1 & 0 & 0 & 0 & 0 & 0 & 0 \\ 0 & 1 & 1 & 1 & 0 & 0 & 0 & 0 & 0 \\ 0 & 1 & 1 & 0 & 1 & 0 & 0 & 0 & 0 \\ 0 & 1 & 1 & 0 & 0 & 1 & 0 & 0 & 0 \\ 1 & 1 & 0 & 0 & 0 & 0 & 1 & 0 & 0 \\ 1 & 1 & 0 & 0 & 0 & 0 & 0 & 1 & 0 \\ 1 & 1 & 0 & 0 & 0 & 0 & 0 & 0 & 1 \end{bmatrix} \begin{bmatrix} S_2 & \dots \\ B_7[0] & \dots \\ B_6[0] & \dots \\ B_5[0] & \dots \\ B_4[0] & \dots \\ B_3[0] & \dots \\ B_5[0] & \dots \\ B_4[0] & \dots \\ B_3[0] & \dots \end{bmatrix} + \begin{bmatrix} 0 \\ 1+S_3 \\ 1 \\ S_3 \\ S_3 \\ S_3 \\ 1 \\ 1 \\ 1 \end{bmatrix} \quad \text{(Eq. 12)}$$

As illustrations, one can consider two separate cases of polynomial distortion described by Eq. 6:

First, the case of $\alpha_2=0.0$, $\alpha_3=0.07$ (HD3 only);
Second, the case of $\alpha_2=0.02$, $\alpha_3=0.07$ (HD2 & HD3)
Solving for $D_{c\_opt}$ for both cases and plotting E and the output spectrum before and after compensation, yields the results shown in FIGS. 13 and 14, respectively.

fin denotes the input frequency bin in a Fourier spectrum. MAG denotes magnitude of the input signal, normalized to a maximum of '1'. ENOB denotes the Effective-Number-of-Bits, and ENOBsc denotes the projected ENOB if the amplitude were 1. SNR and SNRb denote Signal-to-Noise Ratio in dB and in bits, respectively. THD and THDb denote Total-Harmonic-Distortion in dB and in bits, respectively.

Figure 13:
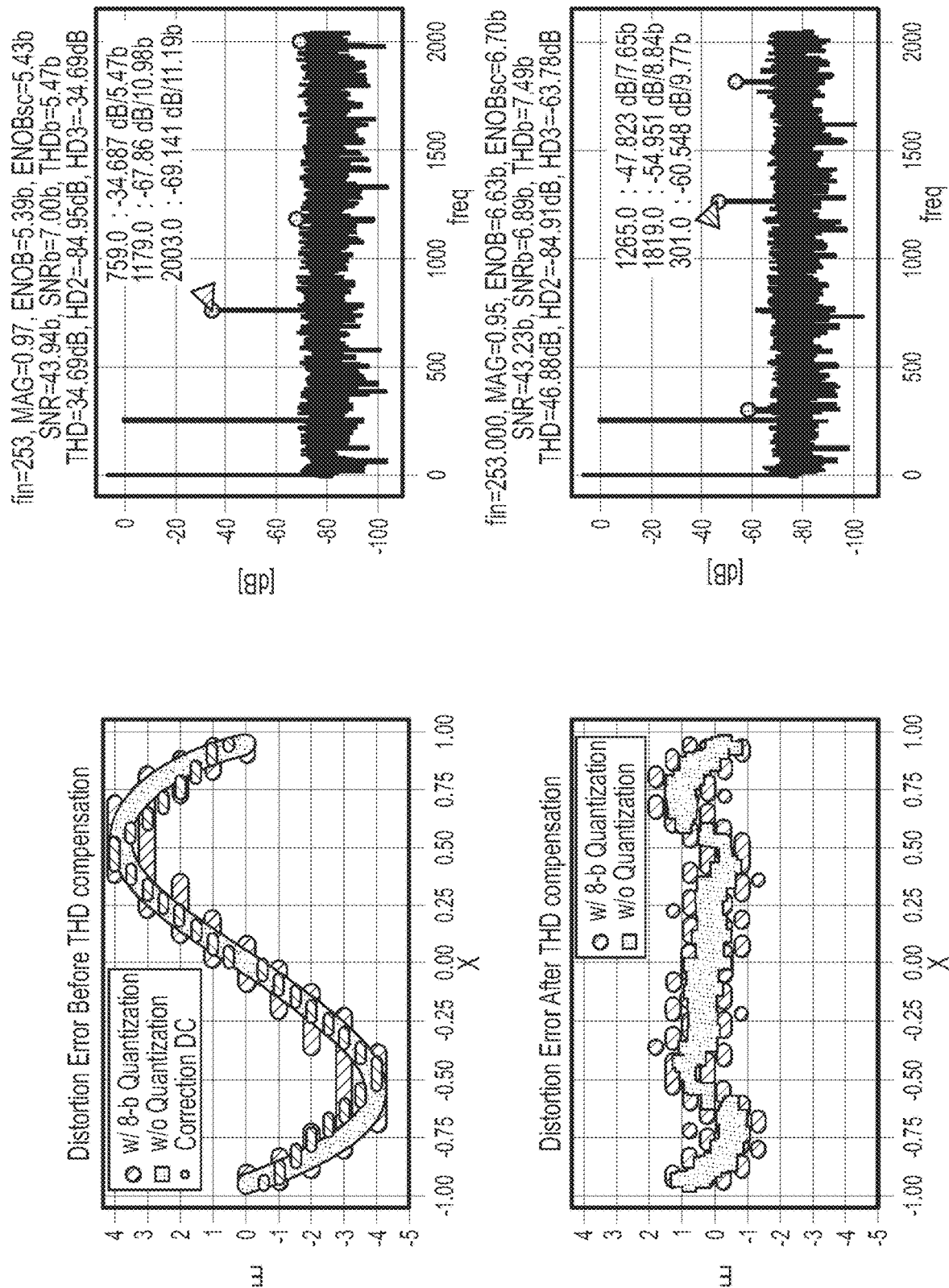
FIG. 13 shows an example of correction of harmonic distortion in accordance with an implementation of the subject matter of this disclosure.
Figure 14:
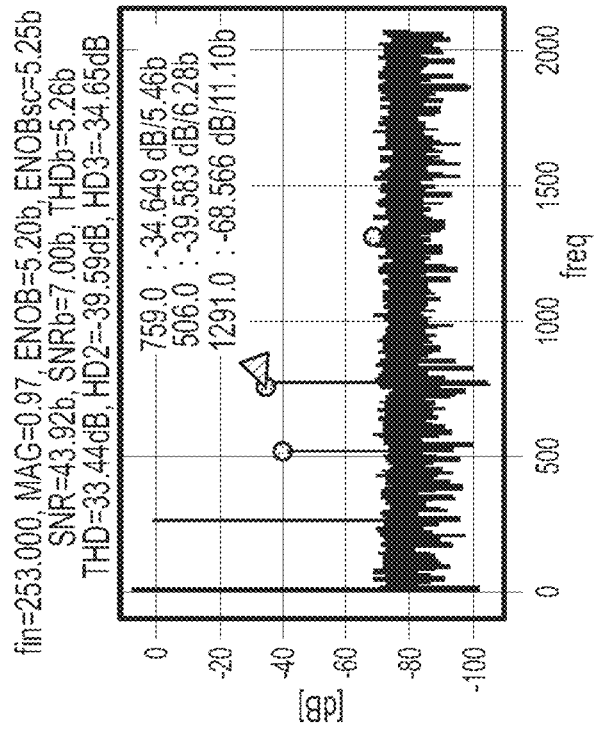
FIG. 14 shows an example of correction of harmonic distortion in accordance with an implementation of the subject matter of this disclosure.
Figure 14:
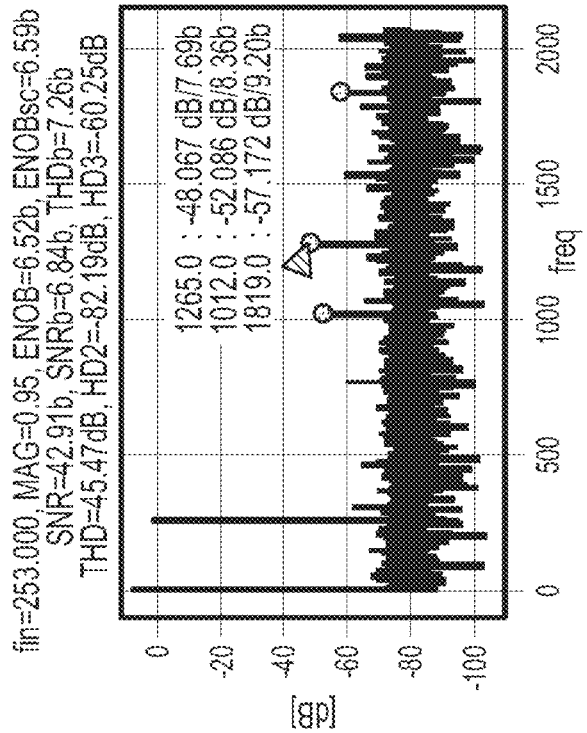
Figure 14:
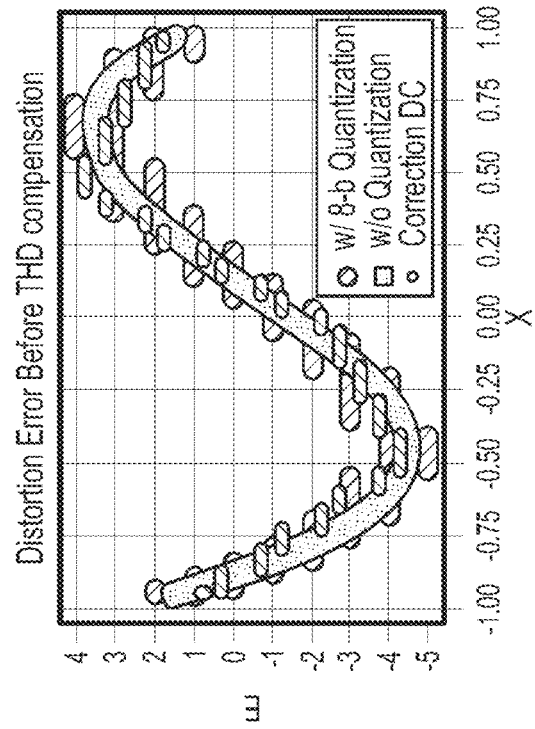
Figure 14:
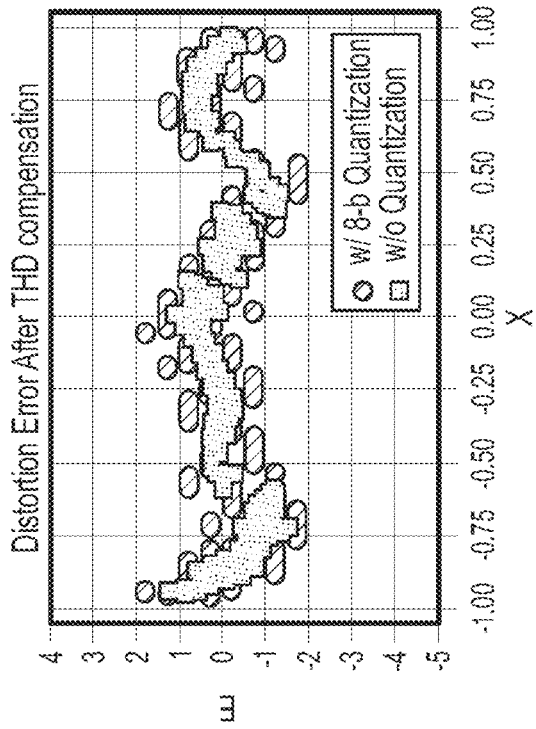

The upper left sub-plot in each of FIGS. 13 and 14 shows the actual distortion error with and without quantization, and also the approximated distortion cancellation $D_{c\_opt}$ as computed. The lower left sub-plot shows the residual distortion error after applying compensation, with and without quantization. The two right-hand subplots show the output spectrum before and after distortion compensation. As can be seen, the THD improvements are two bits for both example cases. However, this may come at a slightly reduced SNR performance of −0.11-bits and −0.16-bits, respectively. This results from using symmetric linear approximation to compensate for complex error curvature, where distortion residuals manifest as reduced spurious DNL tones (mostly at fourth and fifth harmonics) that slightly worsen SNR. Nevertheless, this tradeoff may be favorable in applications where THD from the second and third harmonics are a bigger factor.

Another advantage of this arrangement is its simplicity in hardware implementation, which may be implemented as a digital post correction or a direct analog correction, rather than as full matrix operations.

Figure 15:
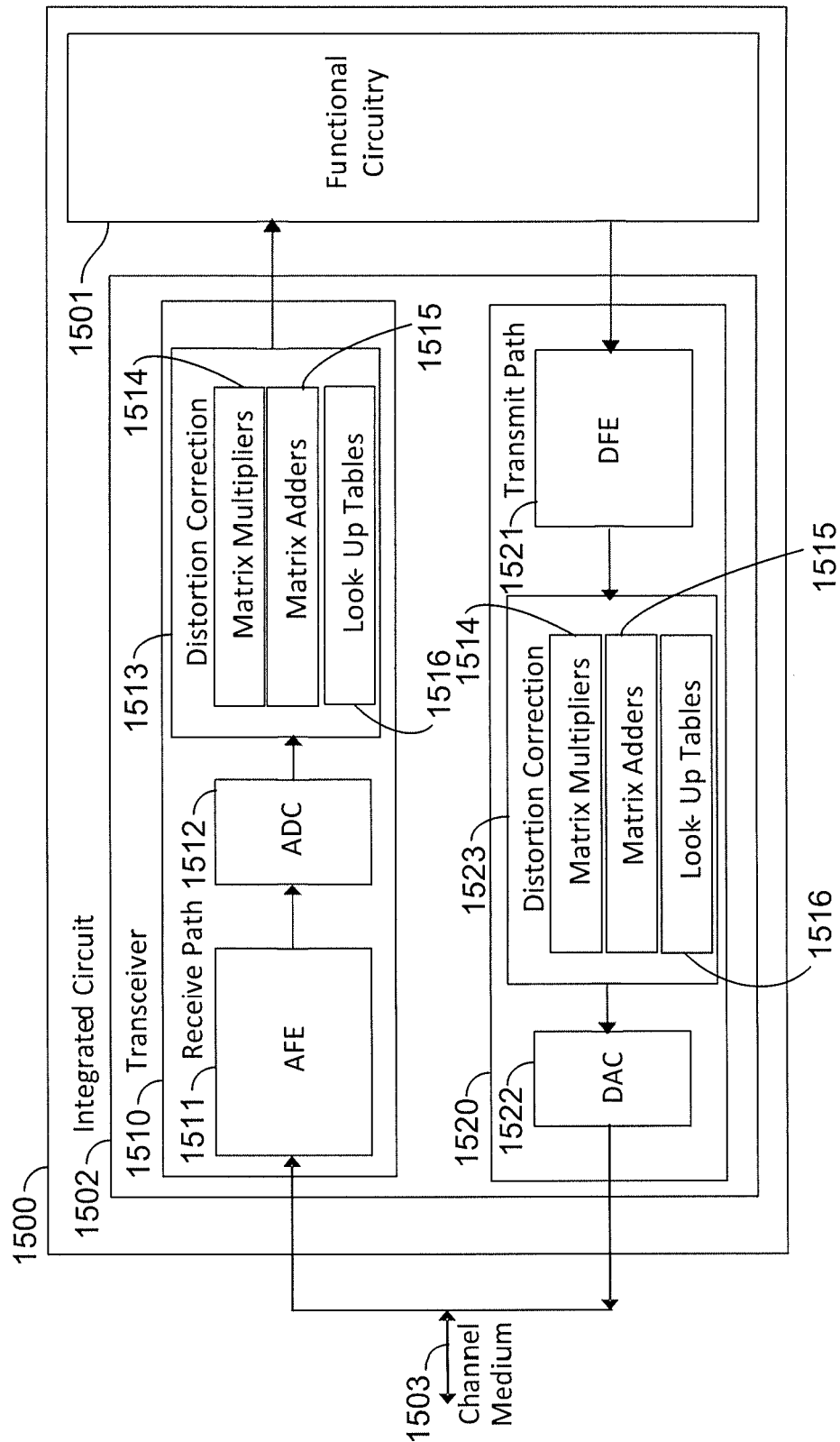
FIG. 15 is a block diagram of an integrated circuit device incorporating the subject matter of this disclosure.

FIG. 15 is a block diagram of an integrated circuit device 1500 including functional circuitry 1501 and a transceiver 1502 incorporating the subject matter of this disclosure, for coupling to a channel medium 1503. Transceiver 1502 includes a receive path 1510 and a transmit path 1520.

Receive path 1510 includes analog front-end (AFE) 1511 which may include filters, equalizers, echo cancellers, etc. (not shown) for conditioning a received signal. The conditioned received signal is digitized in analog-to-digital converter (ADC) 1512, and distortions in the digitized signal are corrected according to one of the techniques described above in distortion correction circuitry 1513, which may include matrix multipliers 1514, matrix adders 1515 and/or look-up tables 1516, as described above, and the corrected signal is output to functional circuitry 1501, which may be provided to perform any user-required function on the corrected data.

Similarly, transmit path 1520 includes digital front-end (DFE) 1521 which may include filters, equalizers, echo cancellers, etc. (not shown) for conditioning, for transmission, a signal generated by the user-required function of functional circuitry 1501. Distortions in the conditioned signal to be transmitted are corrected according to one of the techniques described above in distortion correction circuitry 1523, which may include matrix multipliers 1514, matrix adders 1515 and/or look-up tables 1516, as described above, while still in the digital domain which facilitates processing. The corrected signal is dequantized in digital-to-analog converter (DAC) 1522, and the dequantized corrected signal is output to channel medium 1503.

Figure 16:
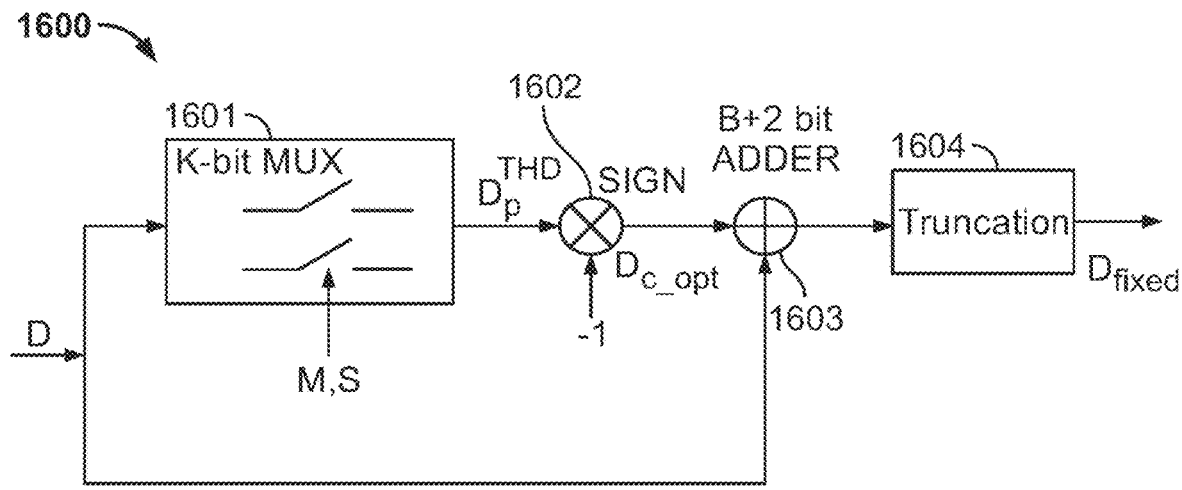
FIG. 16 is a diagram of alternative circuitry for a portion of the circuitry of FIG. 15 according to implementations of the subject matter of this disclosure.

However, in a polynomial distortion compensation implementation as described above, distortion correction circuitry 1513, 1523 may include digital post-correction circuitry 1600 (FIG. 16), instead of matrix multipliers 1514, matrix adders 1515 and/or look-up tables 1516, which, for each output sample or batch of samples D[n], uses Eq. 8a/9a to compute $D_p^{THD}$. Eq. 8a is performed as a K-bit sparse conditional multiplexing operation in digital multiplexer 1601, controlled by a lower diagonal matrix M of 1's and 0's and S as conditions, which can be implemented as simple gates (not shown). M and S can be fixed or programmable, with maximum sizes of $K^2/2$ gates and K gates, respectively. For example, in the illustration shown above in connection with Eq. 12, K=10. $D_{c\_opt}$ is then computed as in Eq. 9b and Eq. 11a, implemented at 1602 as a cascade of two sign bit operations based on $D_p^{THD}$. The final output $D_{fixed}$ may be computed using a (B+2) bit-adder 1603 followed by re-quantization/truncation 1604 with or without rounding, where B is the system native resolution (e.g. B=8-bits in the above examples) and +2 results from allowing digital correction with quarter-LSB (¼ LSB) precision.

Figure 17:
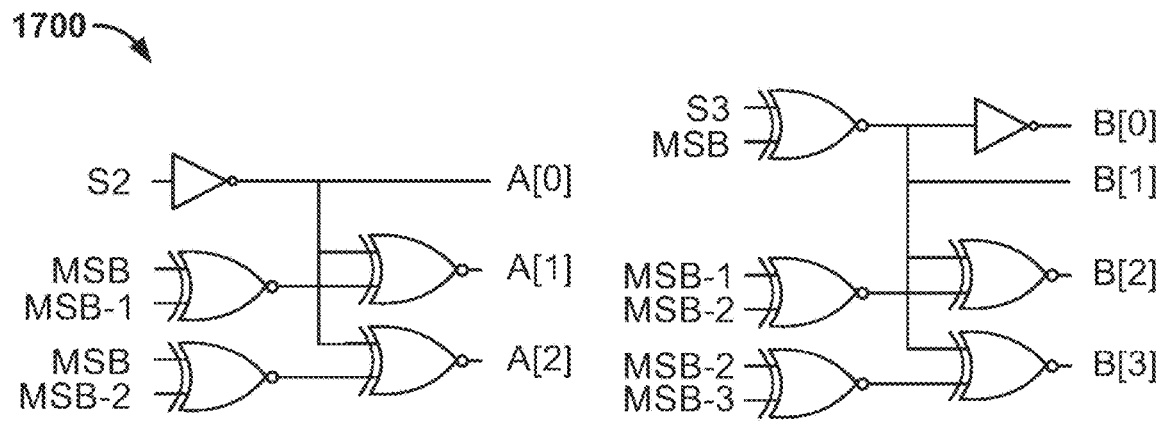
FIGS. 17 and 18 are diagrams of portions of alternative circuitry for a portion of the circuitry of FIG. 15 according to implementations of the subject matter of this disclosure.
Figure 18:
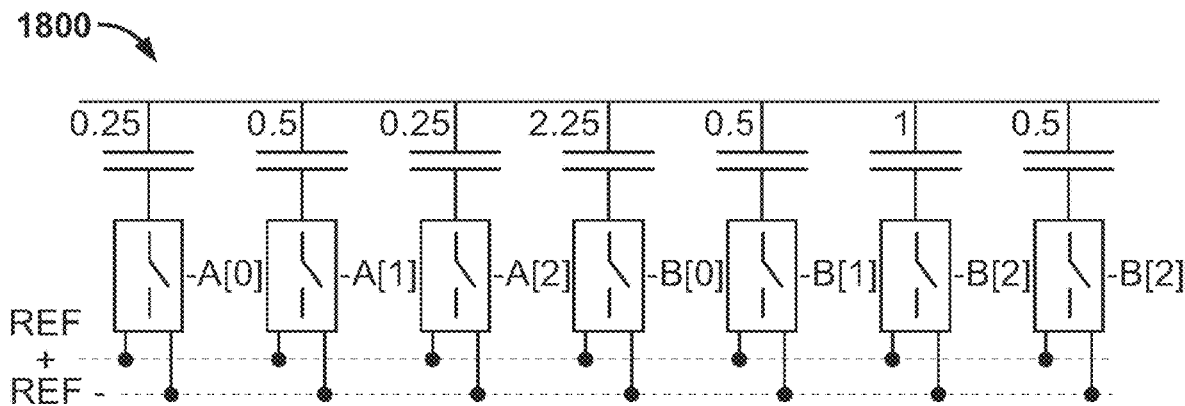

FIGS. 17 and 18 show an analog implementation of the distortion correction circuitry using Successive-Approximation-Register ADC 1700 (as described above) using a small number of logic gates, whose outputs control a capacitive DAC 1800, in which the smallest capacitor is normalized to quarter-LSB (¼ LSB) precision, similar to digital implementation 1600.

Figure 19:
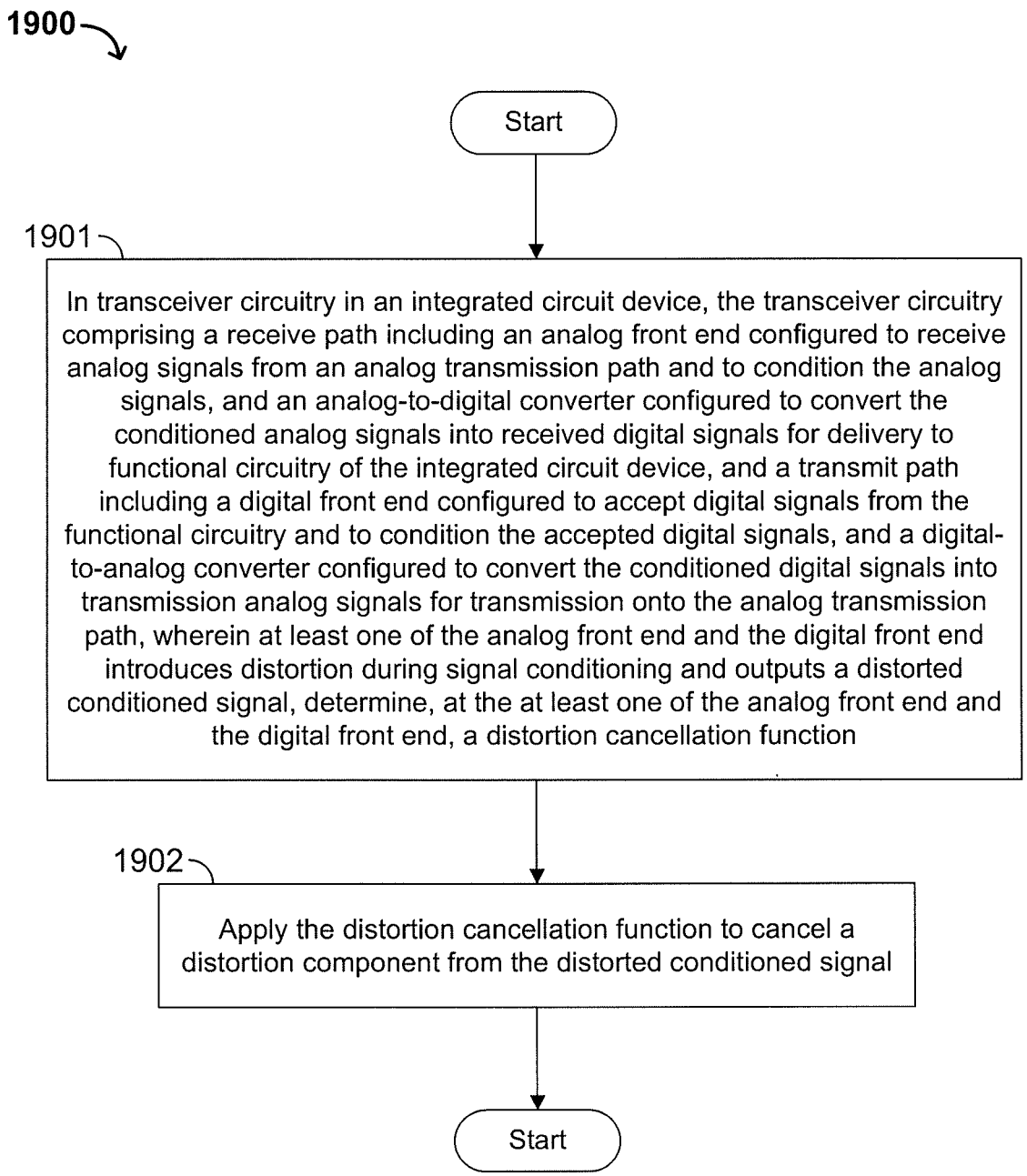
FIG. 19 is a flow diagram illustrating a method in accordance with implementations of the subject matter of this disclosure.

A method 1900 according to implementations of the subject matter of this disclosure is diagrammed in FIG. 19. Method 1900 begins at 1901, where, in transceiver circuitry in an integrated circuit device, the transceiver circuitry comprising a receive path including an analog front end configured to receive analog signals from an analog transmission path and to condition the analog signals, and an analog-to-digital converter configured to convert the conditioned analog signals into received digital signals for delivery to functional circuitry of the integrated circuit device, and a transmit path including a digital front end configured to accept digital signals from the functional circuitry and to condition the accepted digital signals, and a digital-to-analog converter configured to convert the conditioned digital signals into transmission analog signals for transmission onto the analog transmission path, wherein at least one of the analog front end and the digital front end introduces distortion during signal conditioning and outputs a distorted conditioned signal, a distortion cancellation function is determined at the at least one of the analog front end and the digital front end. At 1902, the distortion cancellation function is applied to cancel a distortion component from the distorted conditioned signal. Method 1900 then ends.

Thus it is seen that cancellation, at the front end, of distortion introduced during front-end processing of signals received from, or being transmitted to, a channel medium has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. Transceiver circuitry in an integrated circuit device, the transceiver circuitry comprising:
    a receive path including:
        an analog front end configured to receive analog signals from an analog transmission path and to condition the analog signals, and
        an analog-to-digital converter configured to convert the conditioned analog signals into received digital signals for delivery to functional circuitry of the integrated circuit device; and
    a transmit path including:
        a digital front end configured to accept digital signals from the functional circuitry and to condition the accepted digital signals, and
        a digital-to-analog converter configured to convert the conditioned digital signals into transmission analog signals for transmission onto the analog transmission path; wherein:
    at least one of (a) the analog front end in the receive path, and (b) the digital front end in the transmit path, introduces distortion during signal conditioning and outputs a distorted conditioned signal in a respective one of the receive path and the transmit path; and
    the transceiver circuitry further comprises at least one of:
    receive path distortion correction circuitry at the analog front end, the receive path distortion correction circuitry being configured to determine and apply a receive path distortion cancellation function to cancel a distortion component from the distorted conditioned signal in the receive path prior to the delivery to the functional circuitry of the integrated circuit device, and
    transmit path distortion correction circuitry at the digital front end, the transmit path distortion correction circuitry being configured to determine and apply a transmit path distortion cancellation function to cancel a distortion component from the distorted conditioned signal in the transmit path prior to conversion of the conditioned digital signals into the transmission analog signals for transmission onto the analog transmission path.

2. The transceiver circuitry of claim 1 wherein each respective one of the receive path distortion correction circuitry and the transmit path distortion correction circuitry is configured to determine, as a respective one of the receive path distortion cancellation function and the transmit path distortion cancellation function, a digital inversion of the distortion in the respective distorted conditioned signal, and to apply the digital inversion to the respective conditioned signal.

3. The transceiver circuitry of claim 2 wherein each respective one of the receive path distortion correction circuitry and the transmit path distortion correction circuitry is configured to determine the digital inversion as a superposition of inversion functions.

4. The transceiver circuitry of claim 3 wherein each respective one of the receive path distortion correction circuitry and the transmit path distortion correction circuitry comprises matrix operator circuitry to compute the superposition of inversion functions.

5. The transceiver circuitry of claim 4 wherein the matrix operator circuitry comprises matrix multipliers and matrix adders.

6. The transceiver circuitry of claim 4 wherein the matrix operator circuitry further comprises a look-up table for trigonometric operations.

7. The transceiver circuitry of claim 1 wherein each respective one of the receive path distortion correction circuitry and the transmit path distortion correction circuitry is configured to determine and apply, as the respective distortion cancellation function, a polynomial representation including at least one term that subtracts a distortion correction from the respective distorted conditioned signal.

8. The transceiver circuitry of claim 7 wherein each respective one of the receive path distortion correction circuitry and the transmit path distortion correction circuitry is configured to determine and apply a respective symmetrical polynomial approximation centered on a respective inflection point of the respective distorted conditioned signal.

9. The transceiver circuitry of claim 8 wherein each respective one of the receive path distortion correction circuitry and the transmit path distortion correction circuitry is configured to break up the respective distorted conditioned signal into a plurality of respective symmetrical segments centered on respective inflection points of the respective distorted conditioned signal and to determine and apply respective symmetrical polynomial approximations to the respective symmetrical segments.

10. The transceiver circuitry of claim 9 comprising a successive-approximation-register analog-to-digital converter for determining the polynomial approximations.

11. The transceiver circuitry of claim 9 comprising a digital multiplexer controlled by a sparsely-populated matrix for determining the polynomial approximations.

12. For use in transceiver circuitry in an integrated circuit device, the transceiver circuitry comprising a receive path including an analog front end configured to receive analog signals from an analog transmission path and to condition the analog signals, and an analog-to-digital converter configured to convert the conditioned analog signals into received digital signals for delivery to functional circuitry of the integrated circuit device, and a transmit path including a digital front end configured to accept digital signals from the functional circuitry and to condition the accepted digital signals, and a digital-to-analog converter configured to convert the conditioned digital signals into transmission analog signals for transmission onto the analog transmission path, wherein at least one of (a) the analog front end in the receive path, and (b) the digital front end in the transmit path, introduces distortion during signal conditioning and outputs a distorted conditioned signal in a respective one of the receive path and the transmit path, a method for correcting the respective distorted conditioned signal, the method comprising:

determining, at a respective one of the at least one of the analog front end in the receive path and the digital front end in the transmit path, a respective distortion cancellation function; and applying the respective distortion cancellation function in one of:

the receive path to cancel a distortion component from the distorted conditioned signal in the receive path prior to the delivery to the functional circuitry of the integrated circuit device, or the transmit path to cancel a distortion component from the distorted conditioned signal in the transmit path prior to conversion of the conditioned digital signals into the transmission analog signals for transmission onto the analog transmission path.

13. The method for correcting the distorted conditioned signal according to claim 12 comprising determining, using circuitry, as the respective distortion cancellation function, a digital inversion of the distortion in the respective distorted conditioned signal.

14. The method for correcting the distorted conditioned signal according to claim 13 comprising determining, using circuitry, the digital inversion as a superposition of inversion functions.

15. The method for correcting the distorted conditioned signal according to claim 14 wherein determining, using circuitry, the digital inversion as a superposition of inversion functions comprises performing matrix operations.

16. The method for correcting the distorted conditioned signal according to claim 15 further comprises performing, using circuitry, trigonometric operations.

17. The method for correcting the distorted conditioned signal according to claim 12 comprising determining, using circuitry, as the respective distortion cancellation function, a polynomial representation including at least one term that subtracts a distortion correction from the respective distorted conditioned signal.

18. The method for correcting the distorted conditioned signal according to claim 17 wherein determining the polynomial representation of the respective distortion correction comprises determining a symmetrical polynomial approximation centered on a respective inflection point of the respective distorted conditioned signal.

19. The method for correcting the distorted conditioned signal according to claim 18 further comprising breaking up the respective distorted conditioned signal, using circuitry, into a plurality of respective symmetrical segments centered on respective inflection points of the respective distorted conditioned signal and determining and applying, using circuitry, respective symmetrical polynomial approximations to the respective symmetrical segments.

* * * * *